United States Patent [19]

Ballato et al.

[11] Patent Number: 4,773,138
[45] Date of Patent: Sep. 27, 1988

[54] METHOD OF PRODUCING TRANSDUCER ISOLATION IN SURFACE ACOUSTIC WAVE PROCESSOR

[75] Inventors: Arthur D. Ballato, Long Branch; Elio A. Mariani, Hamilton Square, both of N.J.

[73] Assignee: The United States of America as represented by the Secretary of the Army, Washington, D.C.

[21] Appl. No.: 517,614

[22] Filed: Jul. 27, 1983

Related U.S. Application Data

[62] Division of Ser. No. 375,895, May 7, 1982, Pat. No. 4,403,165.

[51] Int. Cl.$^4$ ............................................. H01L 41/22
[52] U.S. Cl. ............................. 29/25.35; 310/313 D; 333/151
[58] Field of Search ............... 29/25.35; 333/151–154; 310/313 R, 313 A, 313 B, 313 C, 313 D

[56] References Cited

U.S. PATENT DOCUMENTS 4,004,254  1/1977  De Vries ........................... 333/153
4,097,825  6/1978  Gerard ........................... 310/313 D

*Primary Examiner*—Carl E. Hall
*Attorney, Agent, or Firm*—Sheldon Kanars; Robert A. Maikis

[57] ABSTRACT

An improved manufacturing technique for producing a certain class of Surface Acoustic Wave (SAW) devices, namely those having input and output transducers in close proximity. A much higher manufacturing yield results from eliminating the cutting of a slot in the substrate between input and output transducers as formerly done. This frequently destructive step is replaced by ion-milling of a deep groove between the ports and backfilling with a metal of proper configuration to provide elecromagnetic shielding. The technique produces a new device that is at least equal to the prior art in rejection of unwanted couplings between input and output.

3 Claims, 1 Drawing Sheet

METHOD OF PRODUCING TRANSDUCER ISOLATION IN SURFACE ACOUSTIC WAVE PROCESSOR

The invention described herein may be manufactured, used, and licensed by or for the Government for Governmental purposes without the payment to us of any royalties thereon.

This is a divisional of Ser. No. 375,895, filed 5/7/82, now U.S. Pat. No. 4,403,165.

BACKGROUND OF THE INVENTION

This invention is directed to a method of manufacture of Surface Acoustic Wave (SAW) devices. Certain of these devices, such as reflective array compressors (RAC) or slanted array compressors (SAC), which perform pulse compression, chirp transformation and Fourier transformation are configured with input and output ports side-by-side at one end of the device and pointed down the long dimension of the device. Thus, surface acoustic waves are launched by the input transducer, reflected, and received by the output transducer. There is a strong tendency for a large component of an input signal to be fed laterally to the output transducer given the proximity of the input & output transducers. It was to prevent this feed-thru that earlier workers devised cutting a slot into the substrate between the ports, using diamond saws, and inserting a metal wall or septum into this slot. This slot could not be cut until the transducer structures were already in place. Therefore, mistakes at this stage were very costly. In fact, this operation frequently produced cracks in the substrate thereby ruining the nearly completed device. It has not been possible to cut the slot first because the interdigital transducers (IDTs), which launch the SAWS, are applied by photolithographic methods. Cutting the slot first would cause edge effects in the photoresist applied, resulting in poor or unusable IDTs. These problems are completely obviated by our invention since the slot is no longer needed.

BRIEF SUMMARY OF THE INVENTION

The herein disclosed new process and device eliminates this hand-cut slot as a source of RAC device failure. The slot is replaced by a groove which is produced by ion milling. In place of the metal septum of the prior art, the groove is backfilled with a metal, such as aluminum, which is electrically grounded. The primary object of the invention is the achievement of a high manufacturing yield of RAC devices while still suppressing unwanted electromagnetic and acoustic couplings between input and output ports. Another important object is a fabrication method which is amenable to mass production by microelectronic techniques. A still further object is the achievement of greater accuracy in the devices produced.

The foregoing and other objects and advantages of the invention will appear from the following description. In the description reference, reference is made to the accompanying drawings which form a part hereof, and in which there is shown by way of illustration and not of limitation a preferred embodiment. Such description does not represent the full scope of the invention, but rather the invention may be employed in different arrangements and reference is made to the claims herein for interpreting the breadth of the invention.

DETAILED DESCRIPTION OF THE INVENTION

Figure 1:
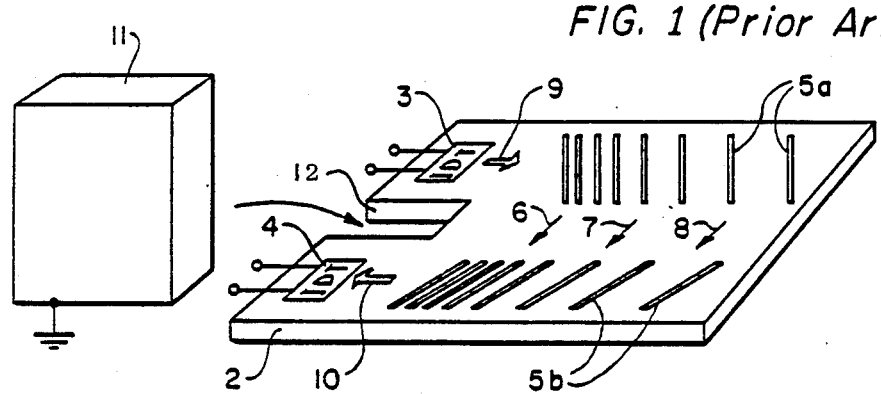
FIG. 1 is a schematic representation of the Prior RAC device.

FIG. 1 illustrates a reflective array compressor (RAC) device of conventional manufacture showing substrate (2) typically lithium niobate, about 2 to 3 mm in thickness. The method of producing this device is as follows:

1. A polished substrate 2 has interdigital transducers (IDTs), or ports, 3 and 4, applied by well-known photolithographic methods.

2. Finished IDTs 3 and 4 are given a protective coating against damage in following step. Photoresist (not shown) is normally used.

3. Shallow Herringbone grooves 5 are etched into surface of substrate 2. They are cut a few hundreds of Angstrom units deep and are set at about 45 degrees to the path 9 and 10 of the acoustic wave.

4. Slot 12 is cut, using a diamond saw, to a length sufficient to separate IDTs.

5. A metallic Septum 11 is inserted and secured into a slot 12.

In the RAC device, SAWs are launched by input transducer 3 and propagate in direction of arrow 9. High frequency, short wavelength signals are reflected by herringbone grooves 5a along arrow 6 toward grooves 5b and then toward output port 4 along direction of arrow 10. Mid-band signals reflect across along arrow 7 and low-band signals along arrow 8.

Figure 2:
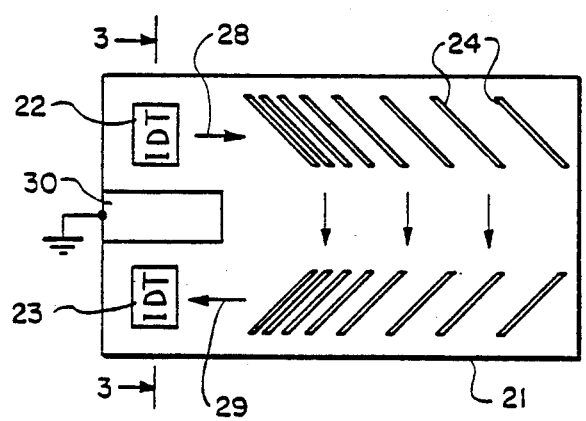
FIG. 2 is a top view of the instant invention.

FIG. 2 is a top view of the inventive device. Instead of a slot, a groove 31 is etched in substrate 21 at the same time and by the same method as for the herringbone grooves 24. Groove 31 extends laterally equidistant between IDTs 22 and 23 and provides acoustic shielding. Groove 31 is partially filled by deposition techniques with a metal 30 which is grounded to prevent electromagnetic feed-thru. FIG. 2 is a schematic representation configured to perform the same signal manipulations as FIG. 1. Thus, high, medium and low band SAWs reflect across the RAC device in the respective areas of arrows 25, 26 and 27.

Figure 3:
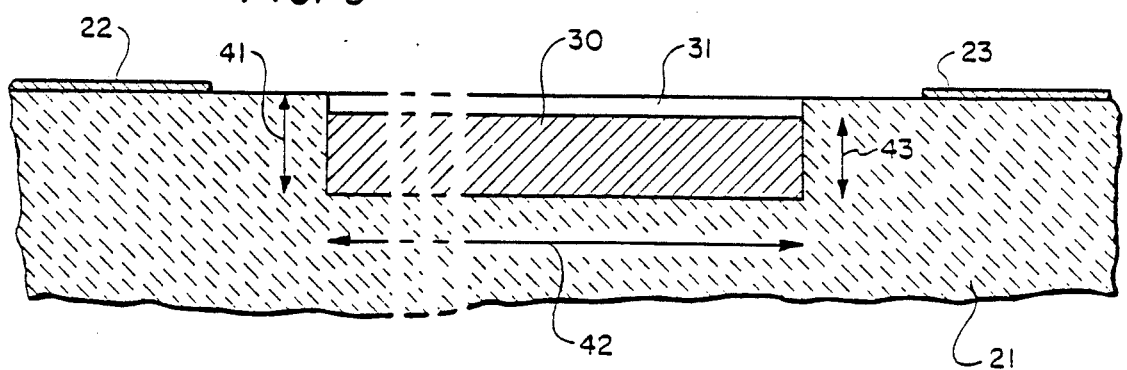
FIG. 3 is a cross-section of the invention taken through 3—3 of FIG. 2.

FIG. 3 better shows the acoustic isolation groove 31 and electromagnetic shield 30. The depth 41 of groove 31 is approximately 3 acoustic wavelengths. In a device built to operate around 300 MHz one wavelength is about 10 micrometers; at 3 GHz it is about 1 micrometer (10,000 A). These depths are readily achieved by chemical ion bombardment (e.g. argon etch) means. Acoustic decoupling between input 22 and output 23 is achieved by adjusting (1) the isolation groove width 42; (2) the depth 41 of groove 31; (3) the degree of metal backfill, and (4) metal of backfill so that the energy (acoustic) that propagates laterally from the IDT structures, toward each other, rather than down the length of the RAC 21, is reflected from the isolation groove 31 back to the IDT from which it originated. The prescription for designing the isolation groove as an acoustic reflector is well-known in the art. The isolation-groove-with-metallic-backfill-structure thus provides both electromagnetic and acoustic decoupling of the input and output ports. A typical isolation groove design would be:

(1) width 42 equal to 100 acoustic wavelengths; (2) depth of etched groove 41 prior to metallic backfill equal to 3 acoustic wavelengths; (3) degree of metal backfill 4 equal to 2 acoustic wavelengths (approximately); (4) metal of backfill: aluminum. In practice the depth 43 of metal backfill may be adjusted up or down to produce a null in coupling. This procedure is simple and quick and may be accomplished during manufacture.

Having thus disclosed our invention, we claim:

1. A method of producing a SAW device on a piezoelectric crystal substrate comprising:
   forming a pair of interdigital transducers on a surface of said substrate at one end thereof and parallel to and equidistant from either side of the centerline of said substrates longest dimension;
   covering said transducers with a layer of protective material;
   etching said surface of said substrate with signal processing grooves in conformance with design criteria;
   etching said surface with a signal isolation groove along said centerline and between said transducers having a length sufficient such that there are no direct paths between said transducers which do not cross said groove, said signal isolation groove having a depth of at least three but less than four acoustic wavelengths of the lowest frequency signal to be processed by said SAW device and a width of approximately one hundred acoustic wavelengths of the lowest frequency signal to be processed by said SAW device; and
   backfilling said signal isolation groove with a metal.

2. The method of claim 1 wherein said signal isolation groove is backfilled to a depth greater than half.

3. The method of claim 1 wherein said backfilled metal is provided with a circuit connection for grounding.

* * * * *